(12) United States Patent
Dragon et al.

(10) Patent No.: US 7,525,152 B2
(45) Date of Patent: Apr. 28, 2009

(54) RF POWER TRANSISTOR DEVICE WITH METAL ELECTROMIGRATION DESIGN AND METHOD THEREOF

(75) Inventors: Christopher P. Dragon, Tempe, AZ (US); Wayne R. Burger, Phoenix, AZ (US); Robert A. Pryor, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 61 days.

(21) Appl. No.: 11/678,330

(22) Filed: Feb. 23, 2007

(65) Prior Publication Data

US 2007/0205506 A1 Sep. 6, 2007

(51) Int. Cl.
*H01L 29/76* (2006.01)
(52) U.S. Cl. ............... 257/341; 257/401; 257/E29.12
(58) Field of Classification Search ............... 257/341
See application file for complete search history.

(56) References Cited

U.S. PATENT DOCUMENTS

| | | | | | |
|---|---|---|---|---|---|
| 5,587,590 | A | * | 12/1996 | Matsubara | ............ 257/48 |
| 5,633,738 | A | * | 5/1997 | Wakui et al. | ............ 349/46 |
| 6,365,918 | B1 | * | 4/2002 | Litwin et al. | ............ 257/77 |
| 6,417,571 | B1 | * | 7/2002 | Nogami et al. | ............ 257/762 |
| 6,417,572 | B1 | * | 7/2002 | Chidambarrao et al. | ..... 257/773 |
| 6,670,639 | B1 | * | 12/2003 | Okabayashi et al. | .......... 257/64 |
| 2004/0238871 | A1 | | 12/2004 | Herzum et al. | |
| 2005/0112866 | A1 | | 5/2005 | Takewaki | |

OTHER PUBLICATIONS

Hau-Riege et al., Use of scanned laser annealing to control the bamboo grain length of Cu interconnects, Applied Physics Letters, Jul. 17, 2000, vol. 77, No. 3, pp. 352-354.*

Hau-Riege et al., Microstructural evolution induced by scanned laser annealing in Al interconnects, Applied Physics Letters, Sep. 6, 1999, vol. 75, No. 10, pp. 1464-1466.*

Tseng et al., Some practical considerations for effective and efficient wafer-level reliability control, Microelectronics Reliability, 44, 2004, pp. 1233-1243, (specifically p. 1239, section 3.2, first paragraph).*

Averbuch et al., Surface evolution in bare bamboo-type metal lines under diffusion and electric field effects, Journal of Computational Physics, 188, 2003, pp. 640-677.*

Hawkins et al., Test and Reliabilitly: Partners in IC Manufacturing Part 1, IEEE Design & Test of Computers, Jul.-Sep. 1999, pp. 61-71.*

Kusuyama et al., Experimental Study of Electromigration at Bamboo Grain Boundaries with a New Test Structure Using the Single-Crystal Aluminum Interconnection, IEEE Transactions on Semiconductor Manufacturing, vol. 9, No. 1, Feb. 1996, pp. 15-19.*

Kwok, Effect of Metal Line Geometry on Electromigration Lifetime in Al-Cu Submicron Interconnects, IEEE International Reliability Physics Symposium, 1988, pp. 185-191.*

Ogurtani et al., Electromigration-induced void grain-boundary interactions: The mean time to failure for copper interconnects with bamboo and near-bamboo structures, Journal of Applied Physics, vol. 96, No. 12, Dec. 15, 2004, pp. 7246-7253.*

PCT/US07/62963 International Search Report and Written Opinion.

* cited by examiner

*Primary Examiner*—David Vu
*Assistant Examiner*—Earl N Taylor (57) ABSTRACT

An RF power transistor with a metal design (70) comprises a drain pad (72) and a plurality of metal drain fingers (74) extending from the drain pad, wherein at least one metal drain finger comprises one or more sections of metal (74-1, 74-2, 100-1, 100-2, 100-3), each section of metal including of one or more branch (54-1, 54-2, 116-1, 116-2, 116-11, 116-21, 116-41) of metal having a metal width maintained within a bamboo regime.

20 Claims, 4 Drawing Sheets

RF POWER TRANSISTOR DEVICE WITH METAL ELECTROMIGRATION DESIGN AND METHOD THEREOF

BACKGROUND

The present disclosures relate to RF devices, and more particularly, to an RF power transistor device with metal electromigration design and method thereof.

RF-LDMOS transistor designs have approached electromigration historically as an issue to be solved by lowering current density. Such an approach leads to wider and wider drain metal lines, which has the negative effect of increasing device capacitances.

Figure 1:
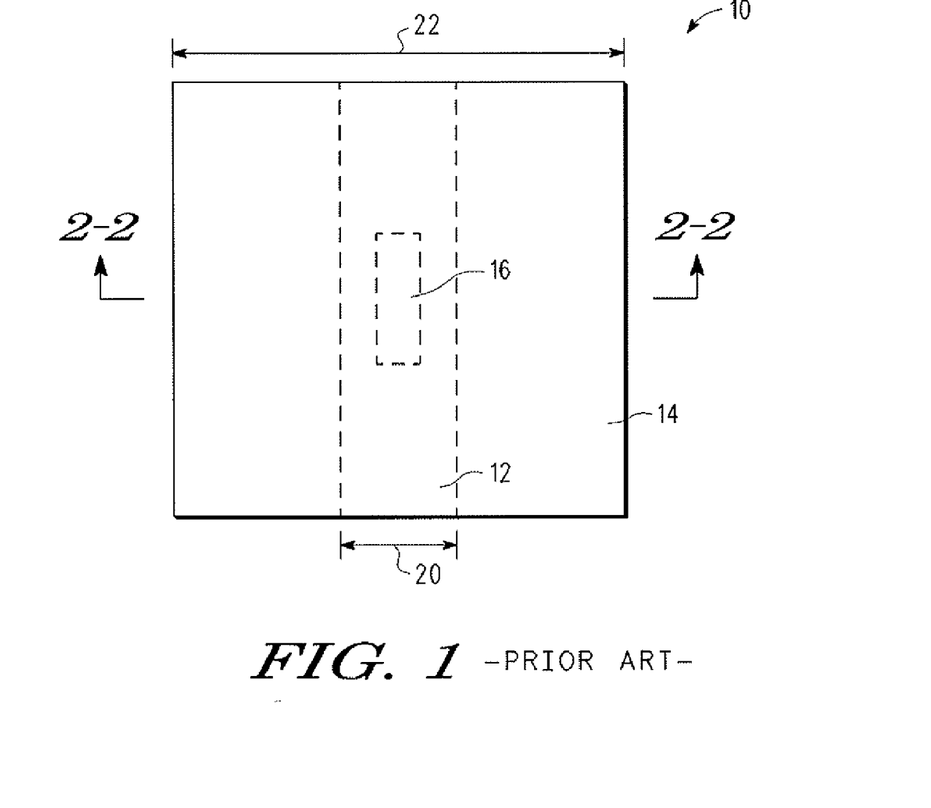
FIG. 1 is a top down diagram view of a portion of a top metal design for an RF MOSFET known in the art.
Figure 2:
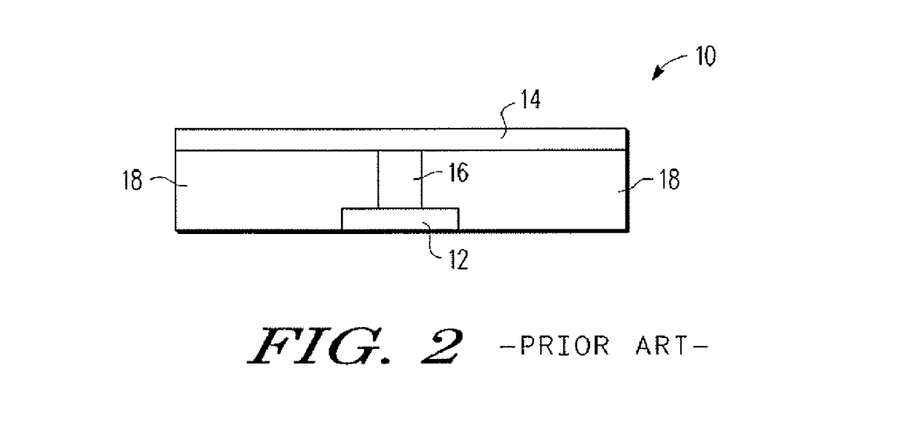
FIG. 2 is a cross-section view of the top metal design of FIG. 1, taken along line 2-2.

FIG. 1 is a top down diagram view of a portion 10 of a top metal design known in the art for an RF MOSFET. FIG. 2 is a cross-section view of the top metal design of FIG. 1, taken along line 2-2. As shown in FIGS. 1 and 2, the portion of the top metal design 10 includes two metal layers, Metal-1 and Metal-2, designated by reference numerals 12 and 14, respectively. Metal-1 layer 12 couples to the Metal-2 layer 14 with a metal via 16. In addition, Metal-2 layer 14 is separated from the Metal-1 layer 12 by an interlevel dielectric layer 18. In addition, the Metal-1 layer 12 has a width as indicated by reference numeral 20. Metal-2 layer 14 has a width as indicated by reference numeral 22. In one example, width 20 for Metal-1 layer 12 is on the order of 2.5 µm and width and width 22 for Metal-2 layer 14 is on the order of 11.2 µm. The top metal design 10 of FIG. 1 suffers from poor electromigration characteristics of the Metal-2 layer, and thus resulting in an inadequate electromigration MTTF (Mean Time To Failure). Electromigration is a wear out mechanism with a log normal failure rate (i.e., failures are not uniformly distributed over time).

In some LDMOS designs, gold is used which provides better electromigration lifetimes inherently. However, the use of gold prevents manufacture of the LDMOS product in standard CMOS fabs.

Accordingly, there is a need for an improved method and apparatus for overcoming the problems in the art as discussed above.

BRIEF DESCRIPTION OF THE DRAWINGS

The present invention is illustrated by way of example and not limited by the accompanying figures, in which like references indicate similar elements, and in which.

The use of the same reference symbols in different drawings indicates similar or identical items. Skilled artisans will also appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 3:
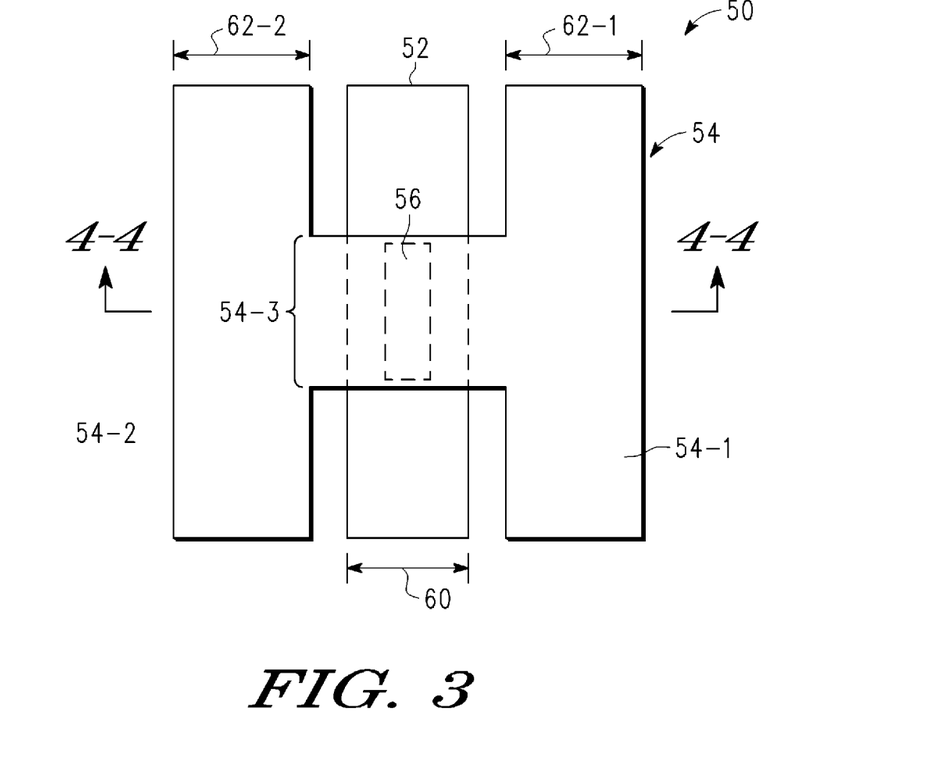
FIG. 3 is a top down diagram view of a portion of a metal design for an RF power transistor having drain metal finger branch widths within the Bamboo regime according to an embodiment of the present disclosure.
Figure 4:
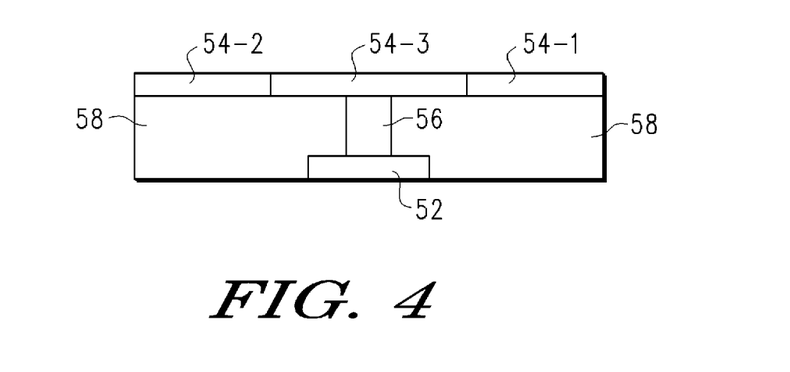
FIG. 4 is a cross-section view of the metal design of FIG. 3, taken along line 4-4.

FIG. 3 is a top down diagram view of a portion 50 of a metal design for an RF power transistor having drain metal finger branch widths within the Bamboo regime according to an embodiment of the present disclosure. In particular, the portion 50 comprises one end of a single RF power transistor drain finger. FIG. 4 is a cross-section view of the metal design of FIG. 3, taken along line 4-4. As shown in FIGS. 3 and 4, the portion of the metal design 50 includes two metal layers. Metal-1 is designated by reference numeral 52. Metal-2 is designated by reference numerals 54-1, 54-2, and 54-3, collectively referred to herein by 54. Metal-2 layer 54-1 forms one branch of one section of an RF power transistor drain finger and Metal-2 layer 54-2 forms another branch of the one section of the finger, wherein the RF power transistor drain finger extends from a low current carrying end to a higher current carrying end, as will be discussed further herein below. In other words, for the given section of the drain finger, Metal-2 layer 54-1 and layer 54-2 comprise two parallel metal lines. In addition, a portion of Metal-2 layer 54-3 couples to a first branch and to a second branch of the given section of the RF power transistor drain finger. The portion of Metal-2 layer indicated by reference numeral 54-3 is coupled to Metal-1 layer 52 with metal via 56. In FIG. 3, the interlevel dielectric 58 (FIG. 4) is not being shown and therefor a portion of Metal-1 layer 52 appears in solid lines in FIG. 3 and another portion appears in phantom, denoting that the corresponding portion of Metal-1 layer 52 appears at a level below Metal-2 layer 54. Similarly, in FIG. 3, metal via 56 is shown in phantom lines.

In one embodiment, Metal-2 layer 54 is the top metal layer of the metal design 50. Additional metal layers (not shown) may also be used, wherein the specific number of layers is determined according to a given RF power transistor design. As mentioned, Metal-1 layer 52 couples to the Metal-2 layer 54 with a metal via 56. In addition, Metal-2 layer 54 is separated from the Metal-1 layer 52 by an interlevel dielectric layer 58. Furthermore, the Metal-1 layer 52 has a width as indicated by reference numeral 60. The branches 54-1 and 54-2 of Metal-2 layer 54 include widths as indicated by reference numeral 62-1 and 62-2, respectively. In one embodiment, the widths 62-1 and 62-2 are on the same order, equal, or substantially equal. In another embodiment, the widths 62-1 and 62-2 are dissimilar, for example, in the case of a non-symmetrical RF power transistor device. In either case, the widths 62-1 and 62-2 are configured so that the metal conductors are in the bamboo regime. In other words, widths 62-1 and 62-2 are selected such that the width of each branch is smaller than an average grain size of the metal being used for that branch, wherein the metal branch width is maintained in the bamboo regime.

In one example, the width 60 for Metal-1 layer 52 is on the order of two-and-a-half microns (2.5 µm) and widths 62-1 and 62-2 for Metal-2 layer 54-1 and 54-2, respectively, are on the order of five microns (5.0 µm). In addition, the Metal-1 layer thickness is on the order of 1.5 μm and the thickness of the Metal-2 layer is on the order of 3.6 μm. In one embodiment, Metal-2 layer 54 comprises aluminum and the branch widths 62-1 and 62-2 place branches 52-1 and 52-2 in the bamboo regime. Accordingly, the top metal design 50 of FIG. 3 does not suffer from poor electromigration characteristics of the Metal-2 layer, and thus provides an improved electromigration MTTF (Mean Time To Failure).

Black's equation, which governs electromigration MTTF, is:

$$MTTF = (A/J^2)\exp(\Phi/kT), \text{ where}$$

A=process constant, function of metal material and geometric properties
  J=current density
  Φ=activation energy for process
  k=Boltzmann's constant
  T=conductor temperature.

The embodiments of the present disclosure make use of Black's equation, in that the metal design layout embodiments of the present disclosure have a direct influence on variables A, J, and T. In other words, the embodiments of the present disclosure comprise novel metal designs configured to significantly enhance the electromigration characteristics of the metal of the metal design. In addition, the metal lines of the metal design are maintained in the bamboo regime.

A historical electromigration strategy has been to characterize relatively wide metal lines that avoid narrow line enhancement effects, i.e., to avoid the so-called "bamboo" regime. However, the historical design is a worst-case approach that simplifies top metal design. Furthermore, no matter what linewidth is used, the actual MTTF of the historical design will be no worse than, and for most lines greater than, the calculated MTTF.

In contrast, according to the embodiments of the present disclosure, the metal design incorporates relatively narrow, parallel metal conductors to ensure bamboo regime operation. As a result, the metal design according to the embodiments of the present disclosure dramatically enhances the electromigration robustness of the drain metal design. Furthermore, the embodiments of the present disclosure can be used to produce RF power transistor devices or RF LDMOS devices that are extremely reliable. In one embodiment, the metal design is a top metal design.

For a calculated reliability, calculated with a linear failure rate approximation, using the top metal design of FIG. 3, for an RF MOSFET output stage at 900 MHz at a given set of rated operating conditions (Pout=89.1 W, ηdc=49%, Gain=19 dB, ΘJC=0.45° C./W. Tcase=95° C., and Tj=138° C.), resulted in a calculated MTTF of 1160 years. In contrast, for a calculated reliability of a historical design of FIG. 1 at rated operating conditions, resulted in a calculated MTTF of 361 years. Accordingly, the embodiments of the present disclosure provide an MTTF that is dramatically improved over the MTTF of the historical design.

Figure 5:
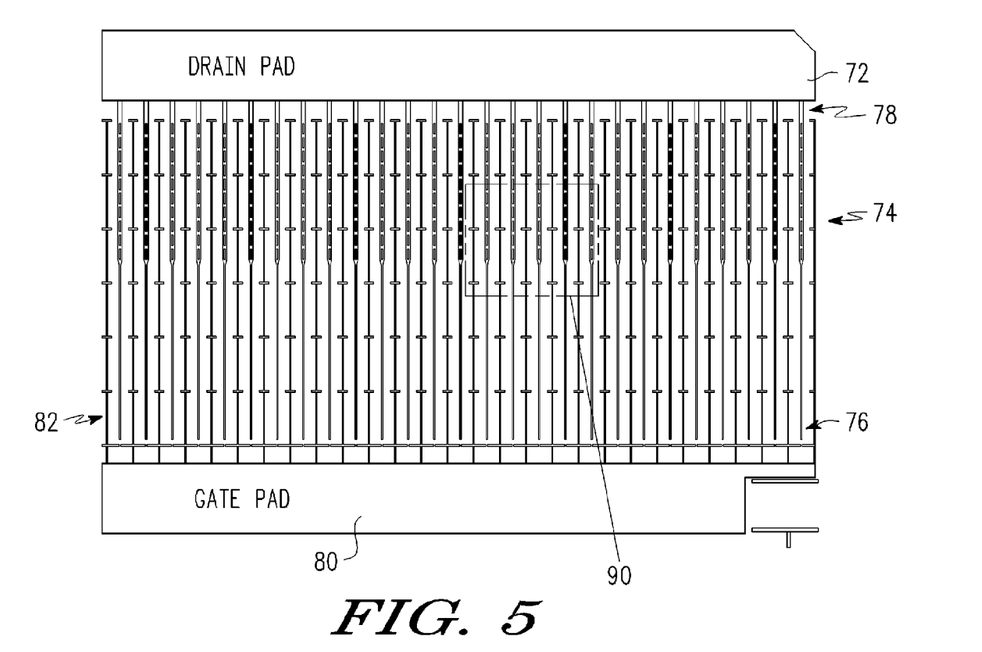
FIG. 5 is a top down diagram view of a portion of a metal design for an RF power transistor having drain metal finger branch widths within the Bamboo regime according to one embodiment of the present disclosure.

FIG. 5 is a top down diagram view of a portion 70 of a metal design for an RF power transistor having drain metal finger branch widths within the Bamboo regime according to one embodiment of the present disclosure. As shown in FIG. 5, the metal design includes a drain pad 72 having a plurality of drain fingers 74, each drain finger extending from a distal end 76 to a proximate end 78. The distal end 76 of drain finger 74 is configured for a first current density remote from the drain pad 72, whereas the proximate end 78 is configured for a second current density proximate the drain pad 72, wherein the second current density is higher than the first current density. The particular current densities, as well as the number of drain fingers, are determined according to the requirements of a given RF power transistor design application. For example, in one embodiment, the number of fingers 74 is one-hundred and thirty (130).

Further with respect to FIG. 5, the metal design 70 includes a gate pad 80 having a plurality of gate fingers generally indicated by reference numeral 82. Each gate finger 82 extends from a distal end to a proximate end. The distal end of the gate finger 82 is remote from the gate pad 80, whereas the proximate end is proximate the gate pad 80. Each gate finger 82 further includes portions 84 that protrude perpendicular to the principal finger, wherein each protruding portion couples to an underlying portion of a gate electrode.

Figure 6:
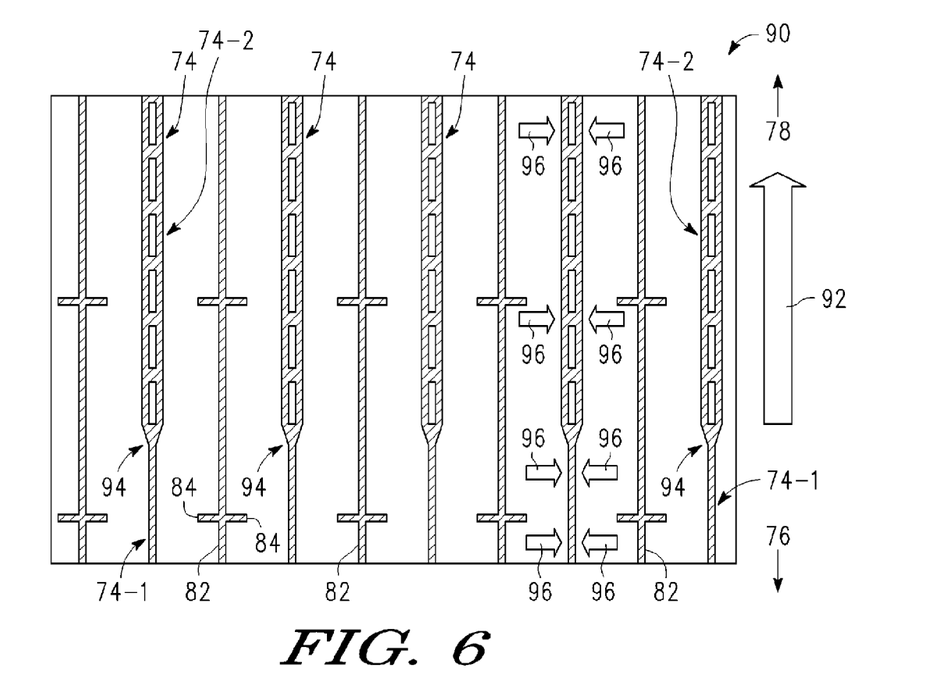
FIG. 6 is an enlarged view of a portion of the top down diagram view of FIG. 5 to illustrate greater detail of the drain metal finger branches.

Referring still to FIG. 5, reference numeral 90 highlights a portion of metal design 70, to be further discussed with respect to FIG. 6. In particular, FIG. 6 is an enlarged view of portion 90 of the top down diagram view of FIG. 5 to illustrate greater detail of the drain metal finger branches 74. As noted above, each drain finger 74 extends from a distal end 76 to a proximate end 78, i.e., proximate the drain pad 72. Drain current of the corresponding RF power transistor device (not shown) passes through each drain finger 74, in the direction of the drain pad 72 as indicated by the arrow 92. In addition, the current density at the distal end 76 is less than the current density at the proximate end 78 of a drain finger.

In the embodiment of FIG. 5, each drain finger 74 includes a first section (or segment) 74-1 and a second section (or segment) 74-2. Note that while only two sections are shown, additional sections are also possible, wherein the number of sections depends upon the particular requirements of a given RF power transistor application. The transition between the first section 74-1 and the second section 74-2 is indicated by reference numeral 94. Each section of the drain finger 74 is designed to handle up to a certain maximum current density. Transition region 94 represents an end to the first section and a beginning of the second section. In one embodiment, the current density capacity of first section 74-1 at transition region 94 corresponds to an upper limit to the maximum current density for the first section 74-1. No additional transition regions are present in the illustrated drain fingers 74 of FIGS. 5 and 6, since the second section 74-2 is sufficient for handling the maximum current density of current accumulated along the entire finger, from the distal end 76 to the proximate end 78. Accordingly, each of the drain finger sections has a length dimension such that the maximum current density allowable, further with respect to a cumulative metal line width for the corresponding section of the drain finger, is not exceeded.

For example, arrows 96 are each representative of a given density of drain current. The first section 74-1 of drain finger 74 is capable of handling four quantities of the drain current represented by arrows 96. The second section 74-2 is capable of handling a total of eight quantities of the drain current represented by arrows 96, four quantities of which were accumulated by the first section 74-1.

Figure 7:
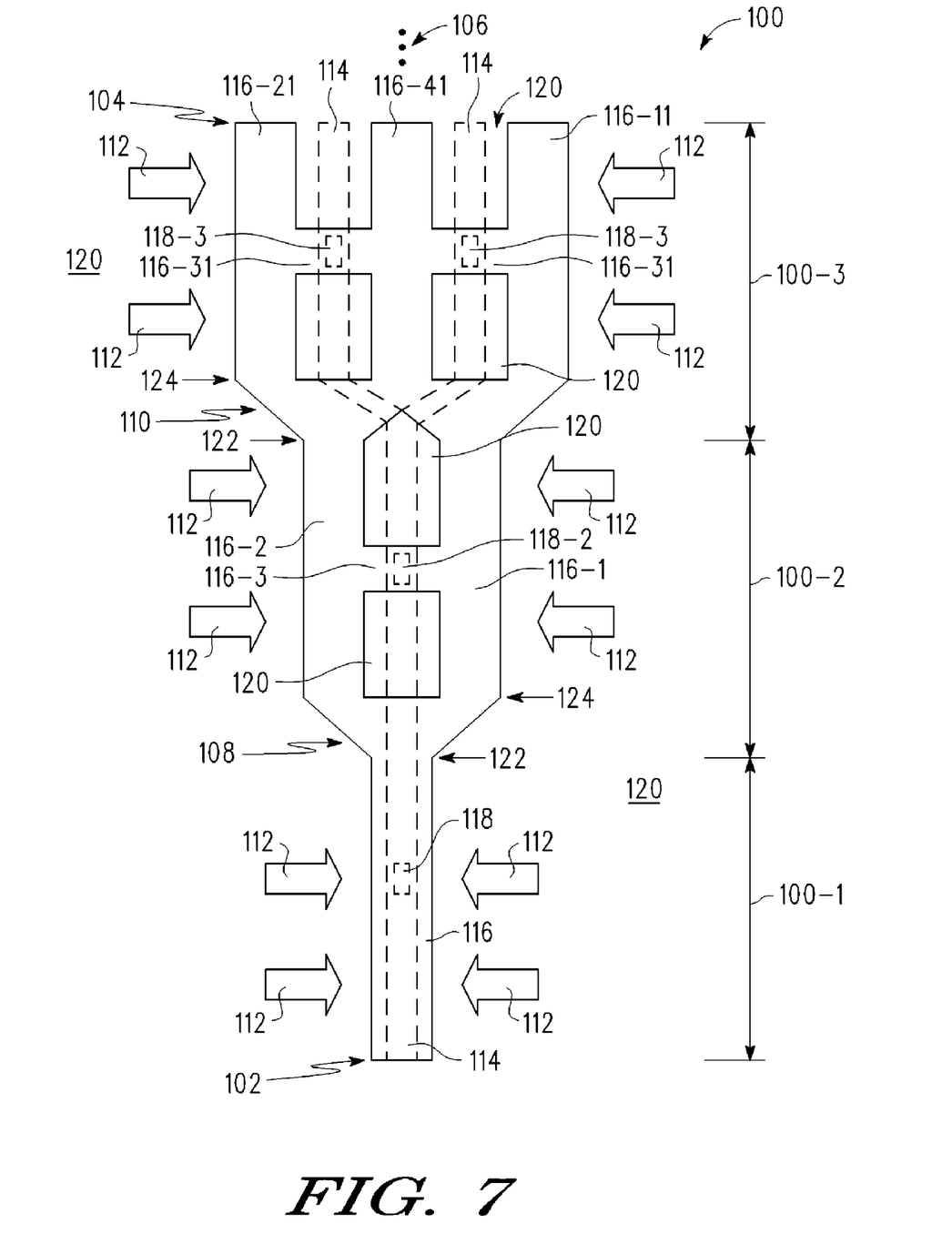
FIG. 7 is a top down diagram view of a single finger of a metal design for an RF power transistor having drain metal finger branch widths within the Bamboo regime according to another embodiment of the present disclosure.

FIG. 7 is a top down diagram view of a single finger 100 of a metal design for an RF power transistor having drain metal finger branch widths within the Bamboo regime according to another embodiment of the present disclosure. As shown in FIG. 7, drain finger 100 extends from a distal end 102 to a proximate end 104 (i.e., proximate end 104 being proximate a drain pad of an RF power transistor device (not shown)). The distal end 102 of drain finger 100 is configured for a first current density remote from the drain pad (not shown), whereas the proximate end 104 is configured for a different current density proximate the drain pad (not shown), wherein the current density at the proximate end is higher than the current density at the distal end. Drain current of a corresponding RF power transistor device (not shown) passes through each section of drain finger 100, in the direction of the drain pad, wherein the current density at the distal end 102 is less than the current density at the proximate end 104 of the drain finger.

In the embodiment of FIG. 7, drain finger 100 includes a first section (or segment) 100-1, a second section (or segment) 100-2, and a third section (or segment) 100-3. Note that while only three sections are shown, additional sections are also possible, as indicated by the "..." and reference numeral 106, wherein the number of sections depends upon the particular requirements of a given RF power transistor application. The transition between the first section 100-1 and the second section 100-2 is indicated by reference numeral 108. The transition between the second section 100-2 and the third section 100-3 is indicated by reference numeral 110. Each section of the drain finger 100 is designed to handle (or have a current density capacity) up to a certain maximum current density. Transition region 108 represents an end to the first section and a beginning of the second section. In one embodiment, the current density capacity of first section 100-1 at transition region 108 corresponds to an upper limit to the maximum current density for the first section 100-1. In addition, the current density capacity of second section 100-2 at transition region 110 corresponds to an upper limit to the maximum current density for the second section 100-2. No additional transition regions are present in the illustrated drain finger 100 of FIG. 7, since the third section 100-3 is sufficient for handling the maximum current density of current accumulated along the entire finger, from the distal end to the proximate end, for a given embodiment. Accordingly, each of the drain finger sections has a length dimension such that the maximum current density allowable, further with respect to a cumulative metal line width for the corresponding section of the drain finger, is not exceeded.

For example, arrows 112 are each representative of a given density of drain current. The first section 100-1 of drain finger 100 is capable of handling four quantities of the drain current represented by arrows 112. The second section 100-2 is capable of handling a total of eight quantities of the drain current represented by arrows 112, four quantities of which were accumulated by the first section 100-1. In addition, the third section 100-3 is capable of handling a total of twelve quantities of the drain current represented by arrows 112, four quantities of which were accumulated by the first section 100-1, and four quantities of which were accumulated by the second section 100-2. In this example, each arrow 112 represents a similar amount of drain current.

Further with respect to FIG. 7, the first section 100-1 comprises two metal layers, Metal-1 (shown in phantom lines) indicated by reference numeral 114 underlying Metal-2, which is designated by reference numeral 116. Metal-2 layer 116 forms one section 100-1 of RF power transistor drain finger 100. Metal-2 layer 116 is coupled to an underlying Metal-1 layer 114 with metal via 118 (shown in phantom lines). In addition, an interlevel dielectric 120 is disposed between the first and second metal layers.

Further as shown in FIG. 7, the second section 100-2 of drain finger 100 comprises two metal layers, similar to that as described with respect to the portion 50 of metal design of FIG. 3. In particular, Metal-1 is designated by reference numeral 114, and is a continuation of the Metal-1 of the first section 100-1. Metal-2 is designated by reference numerals 116-1, 116-2, and 116-3, collectively referred to herein by 116. Metal-2 layer 116-1 forms one branch of section 100-2 of the drain finger 100 and Metal-2 layer 116-2 forms another branch of section 100-2 of the drain finger 100. In other words, for section 100-2 of the drain finger 100, Metal-2 layer 116-1 and layer 116-2 comprise two parallel metal lines. In addition, a portion of Metal-2 layer 116-3 couples to the first branch and the second branch of section 100-2 of the RF power transistor drain finger. The portion of Metal-2 layer indicated by reference numeral 116-3 is coupled to Metal-1 layer 114 with metal via 118-2. In FIG. 7, the interlevel dielectric 120 is shown and therefor Metal-1 layer 114 within section 100-2 appears in phantom, denoting that the corresponding portion of Metal-1 layer 114 appears at a level that is below Metal-2 layer 116. Similarly, in FIG. 7, metal via 118-2 is shown in phantom lines.

Still further as shown in FIG. 7, the third section 100-3 of drain finger 100 comprises two metal layers, similar to that as described with respect to the portion 50 of top metal design of FIG. 3. Metal-1 is designated by reference numeral 114, and is a continuation of the Metal-1 of the second section 100-2, with the exception that now Metal-1 comprises two parallel lines of metal. In another embodiment, Metal-1 layer 114 of the third section 100-3 could also be a single line continuation of the Metal-1 line of the second section 100-2, wherein the Metal-1 layer would occur below branch 116-41 and be coupled to Metal-2 layer 116 with a suitable via, similar to 118-3. Metal-2 is designated by reference numerals 116-11, 116-21, 116-31, and 116-41 collectively referred to herein by 116. Metal-2 layer 116-11 forms one branch of section 100-3 of the drain finger 100, Metal-2 layer 116-21 forms another branch of section 100-3 of the drain finger 100, and Metal-2 layer 116-41 forms yet another branch of section 100-3 of the drain finger 100. In other words, for section 100-3 of the drain finger 100, Metal-2 layer 116-11, layer 116-41, and layer 116-21 comprise three parallel metal lines. In addition, two portions of Metal-2 layer 116-31 couple to the first branch, the second branch, and the third branch of section 100-3 of the RF power transistor drain finger 100, as shown. The portions of Metal-2 layer indicated by reference numeral 116-31 are coupled to Metal-1 layer 114 with metal vias 118-3. In FIG. 7, the interlevel dielectric 120 is shown and therefor Metal-1 layer 114 within section 100-3 appears in phantom, denoting that the corresponding portion of Metal-1 layer 114 appears at a level that is below Metal-2 layer 116. Similarly, in FIG. 7, metal vias 118-3 are shown in phantom lines.

In one embodiment, Metal-2 layer 116 is the top metal layer of the metal design drain finger 100. Additional metal layers (not shown) may also be used, wherein the specific number of layers is determined according to a given RF power transistor design. In addition, in another embodiment, Metal-2 layer 116 could comprise a metal layer other than the top metal layer. As mentioned, Metal-1 layer 114 couples to the Metal-2 layer 116 with metal vias 118. In addition, Metal-2 layer 116 is separated from the Metal-1 layer 114 by an interlevel dielectric layer 120. In addition, the Metal-1 layer 114 has a given width. The branches of Metal-2 layer 116 include given widths. In one embodiment, the widths of the branches of Metal-2 layer 116 are on the same order, equal, or substantially equal. In particular, the branch widths of Metal-2 layer 116 are configured so that the metal conductors are in the bamboo regime. In other words, the branch widths of Metal-2 layer 116 are selected such that the width of each branch is smaller than an average grain size of the metal being used for that branch, wherein the metal branch width is maintained in the bamboo regime.

In addition, the width(s) of the Metal-2 layer 116 in a transition region (for example region 108 or 110) between adjacent sections of the drain finger will vary from a first width(s) at a distal end 122 to a second width at a proximate end 124. The first width(s) corresponds to a metal branch width needed to maintain the metal line in the bamboo regime. For any given transition region, the second width is determined as a function of the number of branches contained in the subsequent section. In other words, the second width is sufficient for accommodating the total widths of the initial portions (i.e., corresponding to the lower current density end) of the branches contained in the next section of the drain finger. Note also that the particular shape of the transition region(s) can be of a shape or shapes other than what is shown in the figures.

According to one embodiment of the present disclosure, there is provided an RF power transistor with a metal design comprising a drain pad and a plurality of metal drain fingers extending from the drain pad, wherein at least one metal drain finger comprises one or more sections of metal, each section of metal including one or more branch of metal having a metal width maintained within a bamboo regime. The metal width for the bamboo regime comprises a width that is smaller than an average grain size of the metal of the drain finger. In one embodiment, the at least one metal drain finger can comprise a first section of metal and a second section of metal, the first section of metal being distal from the drain pad and the second section being proximate the drain pad. Furthermore, the first section of metal can comprise a single branch of metal and the second section of metal can comprise two parallel branches of metal. In another embodiment, the metal drain fingers comprise a top metal.

According to another embodiment, the metal drain finger comprises a number of sections of metal, each section of metal including one or more branch of metal having a metal width maintained within the bamboo regime and wherein for any two succeeding sections, a distal section of the two contains at least one less branch than a proximate section of the two. In addition, the metal drain finger can comprise three sections of metal, a first section having one branch and being coupled to a second section having two parallel branches, the second section further being coupled a third section having three parallel branches. Furthermore, the first section is distal from the drain pad and the third section is proximate the drain pad.

According to still another embodiment, an RF power transistor with a metal design comprises a drain pad and a plurality of metal drain fingers extending from the drain pad. Each metal drain finger comprises one or more sections of metal, each section of metal including of one or more branch of metal having a metal width maintained within a bamboo regime, wherein the metal width for the bamboo regime comprises a width that is smaller than an average grain size of the metal of the drain finger. In another embodiment, the metal drain finger comprises a first section of metal and a second section of metal, the first section of metal being distal from the drain pad and the second section being proximate the drain pad. Furthermore, the first section of metal can comprise a single branch of metal and the second section of metal can comprise two parallel branches of metal.

According to yet another embodiment, the metal drain finger comprises a number of sections of metal, each section of metal including one or more branch of metal having a metal width maintained within the bamboo regime and wherein for any two succeeding sections, a distal section of the two contains at least one less branch than a proximate section of the two. In a further embodiment, the metal drain finger can comprise three sections of metal, a first section having one branch and being coupled to a second section having two parallel branches, the second section further being coupled a third section having three parallel branches. Still further, the first section is distal from the drain pad and the third section is proximate the drain pad.

According to a further embodiment, there is provided a method of making an RF power transistor with a metal design. The method comprises providing a drain pad and extending a plurality of metal drain fingers from the drain pad. At least one metal drain finger comprises one or more sections of metal, each section of metal including one or more branch of metal having a metal width maintained within a bamboo regime. In one embodiment, the metal width for the bamboo regime comprises a width that is smaller than an average grain size of the metal of the drain finger. In another embodiment, extending includes extending at least one metal drain finger that includes a first section of metal and a second section of metal, the first section of metal being distal from the drain pad and the second section being proximate the drain pad. In addition, the first section of metal can include a single branch of metal and the second section of metal can include two parallel branches of metal.

In yet another embodiment, extending the metal drain finger comprises extending a number of sections of metal, each section of metal including one or more branch of metal having a metal width maintained within the bamboo regime and wherein for any two succeeding sections, a distal section of the two contains at least one less branch than a proximate section of the two. Furthermore, extending the metal drain finger can comprise extending three sections of metal, a first section having one branch and being coupled to a second section having two parallel branches, the second section further being coupled a third section having three parallel branches, still further wherein the first section is distal from the drain pad and the third section is proximate the drain pad.

According to the embodiments of the present disclosure, rather than have a single metal drain line which lowers current density to a level which achieves a certain level of electromigration lifetime, the drain finger metal line is divided into two or more parallel narrower lines. The widths of these narrow lines are designed to ensure that the lines operate in the bamboo regime (i.e. the linewidth is less than the mean grain size of the metal being used for the metal line). As the linewidths of the metal lines enter the bamboo regime, their corresponding electromigration lifetimes increase dramatically since there are fewer migration pathways along grain boundaries. In one embodiment, the metal lines comprise aluminum or any other metal selected according to the requirements of a given RF power transistor application.

The embodiments of the present disclosure advantageously allow equivalent electromigration lifetimes to be achieved with narrower linewidths avoiding capacitance penalties that degrade RF performance, or for an equivalent total drain linewidth, the lifetime can be dramatically improved, thus improving reliability.

In the foregoing specification, the disclosure has been described with reference to the various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments. For example, one embodiment of the present disclosure includes an RF-LDMOS 125 W power transistor used for example, in a mobile communication device or the like. The embodiments of the present disclosure can also apply to any suitable RF MOSFET devices.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An RF power transistor with a metal design comprising:
a drain pad; and
a plurality of metal drain fingers extending from the drain pad, wherein at least one metal drain finger comprises one or more sections of metal, each section of metal including one or more branch of metal having a metal width maintained within a bamboo regime, wherein the at least one metal drain finger comprises a first section of metal and a second section of metal, the first section of metal being distal from the drain pad and the second section being proximate the drain pad, further wherein the first section of metal comprises a single branch of metal and the second section of metal comprises two parallel branches of metal.

2. The RF power transistor of claim 1, wherein the metal width for the bamboo regime comprises a width that is smaller than an average grain size of the metal of the drain finger.

3. The RF power transistor of claim 1, wherein the metal drain fingers comprise a top metal.

4. An RF power transistor with a metal design comprising:
a drain pad; and
a plurality of metal drain fingers extending from the drain pad, wherein at least one metal drain finger comprises one or more sections of metal, each section of metal including one or more branch of metal having a metal width maintained within a bamboo regime, wherein the at least one metal drain finger comprises a number of sections of metal, each section of metal including one or more branch of metal having a metal width maintained within the bamboo regime and wherein for any two succeeding sections, a distal section of the two contains at least one less branch than a proximate section of the two.

5. The RF power transistor of claim 4, wherein the at least one metal drain finger comprises a first section of metal and a second section of metal, the first section of metal being distal from the drain pad and the second section being proximate the drain pad.

6. The RF power transistor of claim 5, further wherein the first section of metal comprises a single branch of metal and the second section of metal comprises two parallel branches of metal.

7. The RF power transistor of claim 4, further wherein the at least one metal drain finger comprises three sections of metal, a first section having one branch and being coupled to a second section having two parallel branches, the second section further coupled a third section having three parallel branches.

8. The RF power transistor of claim 7, still further wherein the first section is distal from the drain pad and the third section is proximate the drain pad.

9. An RF power transistor with a metal design comprising:
a drain pad; and
a plurality of metal drain fingers extending from the drain pad, wherein each metal drain finger comprises one or more sections of metal, each section of metal including of one or more branch of metal having a metal width maintained within a bamboo regime, wherein the metal width for the bamboo regime comprises a width that is smaller than an average grain size of the metal of the drain finger, wherein at least one of the metal drain fingers comprises a first section of metal and a second section of metal, the first section of metal being distal from the drain pad and the second section being proximate the drain pad, further wherein the first section of metal comprises a single branch of metal and the second section of metal comprises two parallel branches of metal.

10. The RF power transistor of claim 9, further wherein at least one of the metal drain fingers comprises three sections of metal, a first section having one branch and being coupled to a second section having two parallel branches, the second section further being coupled a third section having three parallel branches.

11. The RF power transistor of claim 10, still further wherein the first section is distal from the drain pad and the third section is proximate the drain pad.

12. An RF power transistor with a metal design comprising:
a drain pad; and
a plurality of metal drain fingers extending from the drain pad, wherein each metal drain finger comprises one of more sections of metal, each section of metal including of one or more branch of metal having a metal width maintained within a bamboo regime, wherein the metal width for the bamboo regime comprises a width that is smaller than an average grain size of the metal of the drain finger, wherein at least one of the metal drain fingers comprises a number of sections of metal, each section of metal including one or more branch of metal having a metal width maintained within the bamboo regime and wherein for any two succeeding sections, a distal section of the two contains at least one less branch than a proximate section of the two.

13. The RF power transistor of claim 12, wherein at least one of the metal drain fingers comprises a first section of metal and a second section of metal, the first section of metal being distal from the drain pad and the second section being proximate the drain pad.

14. The RF power transistor of claim 13, further wherein the first section of metal comprises a single branch of metal and the second section of metal comprises two parallel branches of metal.

15. A method of making an RF power transistor with a metal design comprising:
providing a drain pad; and
extending a plurality of metal drain fingers from the drain pad, wherein at least one metal drain finger comprises one or more sections of metal, each section of metal including one or more branch of metal having a metal width maintained within a bamboo regime, wherein extending includes extending at least one metal drain finger that includes a first section of metal and a second section of metal, the first section of metal being distal from the drain pad and the second section being proximate the drain pad, further wherein the first section of metal includes a single branch of metal and the second section of metal includes two parallel branches of metal.

16. The method of claim 15, wherein the metal width for the bamboo regime comprises a width that is smaller than an average grain size of the metal of the drain finger.

17. A method of making an RF power transistor with a metal design comprising:

providing a drain pad; and extending a plurality of metal drain fingers from the drain pad, wherein at least one metal drain finger comprises one or more sections of metal, each section of metal including one or more branch of metal having a metal width maintained within a bamboo regime, and wherein extending the at least one metal drain finger comprises extending a number of sections of metal, each section of metal including one or more branch of metal having a metal width maintained within the bamboo regime and wherein for any two succeeding sections, a distal section of the two contains at least one less branch than a proximate section of the two.

18. The method of claim 17, further wherein extending the at least one metal drain finger comprises extending three sections of metal, a first section having one branch and being coupled to a second section having two parallel branches, still further wherein the first section is distal from the drain pad and the third section is proximate the drain pad.

19. The method of claim 17, wherein extending includes extending at least one metal drain finger that includes a first section of metal and a second section of metal, the first section of metal being distal from the drain pad and the second section being proximate the drain pad.

20. The method of claim 19, further wherein the first section of metal includes a single branch of metal and the second section of metal includes two parallel branches of metal.

* * * * *